United States Patent
Anderson et al.

(10) Patent No.: US 7,821,109 B2
(45) Date of Patent: Oct. 26, 2010

(54) STRESSED DIELECTRIC DEVICES AND METHODS OF FABRICATING SAME

(75) Inventors: Brent Alan Anderson, Jericho, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/570,045

(22) Filed: Sep. 30, 2009

(65) Prior Publication Data

US 2010/0013019 A1 Jan. 21, 2010

Related U.S. Application Data

(62) Division of application No. 11/679,880, filed on Feb. 28, 2007, now Pat. No. 7,626,244.

(51) Int. Cl.
*H01L 23/58* (2006.01)
(52) U.S. Cl. .......................... 257/640; 257/18; 257/255; 257/368; 257/649; 257/E29.193; 438/791; 438/778
(58) Field of Classification Search ................. 257/640, 257/E29.193, 18, 255, 649, 368; 438/791, 438/778
See application file for complete search history.

(56) References Cited

U.S. PATENT DOCUMENTS

| 7,002,209 | B2 | 2/2006 | Chen et al. |
| 7,052,946 | B2 | 5/2006 | Chen et al. |
| 7,101,744 | B1 * | 9/2006 | Dyer et al. .................. 438/197 |
| 7,102,201 | B2 | 9/2006 | Furukawa et al. |
| 7,183,613 | B1 | 2/2007 | Zhu et al. |
| 2005/0189589 | A1 | 9/2005 | Zhu et al. |
| 2006/0113641 | A1 | 6/2006 | Hohage et al. |

OTHER PUBLICATIONS

Notice of Allowance (Mail Date Jul. 17, 2009) for U.S. Appl. No. 11/679,880, filed Feb. 28, 2007; Confirmation No. 4311.

* cited by examiner

*Primary Examiner*—Tu-Tu V Ho
(74) *Attorney, Agent, or Firm*—Schmeiser, Olsen & Watts; Richard M. Kotulak (57) ABSTRACT

A structure and a method of making the structure. The structure includes a field effect transistor including: a first and a second source/drain formed in a silicon substrate, the first and second source/drains spaced apart and separated by a channel region in the substrate; a gate dielectric on a top surface of the substrate over the channel region; and an electrically conductive gate on a top surface of the gate dielectric; and a dielectric pillar of a first dielectric material over the gate; and a dielectric layer of a second dielectric material over the first and second source/drains, sidewalls of the dielectric pillar in direct physical contact with the dielectric layer, the dielectric pillar having no internal stress or an internal stress different from an internal stress of the dielectric layer.

26 Claims, 12 Drawing Sheets

STRESSED DIELECTRIC DEVICES AND METHODS OF FABRICATING SAME

This application is a division of U.S. patent application Ser. No. 11/679,880 filed on Feb. 28, 2007.

FIELD OF THE INVENTION

The present invention relates to the field of semiconductor device technology; more specifically, it relates to stressed field effect transistors and methods of manufacturing stressed field effect transistors.

BACKGROUND OF THE INVENTION

Introduction of the invention. As field effect transistors have been scaled to smaller dimensions, the majority channel carrier mobility has not scaled greater proportionally to the decreased dimensions so the full impact of down scaling on device performance has not been realized. Therefore, there exist a need for devices with greater majority channel carrier mobility and methods of fabricating devices with greater majority channel carrier mobility.

SUMMARY OF THE INVENTION

A first aspect of the present invention is a structure, comprising: a field effect transistor comprising: a first and a second source/drain formed in a silicon substrate, the first and second source/drains spaced apart and separated by a channel region in the substrate; a gate dielectric on a top surface of the substrate over the channel region; and an electrically conductive gate on a top surface of the gate dielectric; and a dielectric pillar of a first dielectric material over the gate; and a dielectric layer of a second dielectric material over the first and second source/drains, sidewalls of the dielectric pillar in direct physical contact with the dielectric layer, the dielectric pillar having no internal stress or an internal stress different from an internal stress of the dielectric layer.

A second aspect of the present invention is a structure, comprising: an NFET comprising: a first and a second source/drain formed in a silicon substrate, the first and second source/drains spaced apart and separated by a first channel region in the substrate; a first gate dielectric on a top surface of the substrate over the first channel region; and a first electrically conductive gate on a top surface of the first gate dielectric; and a PFET comprising: a third and a fourth source/drain formed in the silicon substrate, the third and fourth source/drains spaced apart and separated by a second channel region in the substrate; a second gate dielectric on the top surface of the substrate over the second channel region; and an electrically conductive second gate on a top surface of the second gate dielectric; and a first dielectric layer of a first dielectric material over the first gate and the third and fourth source/drain regions; and a second dielectric layer of a second dielectric material over the second gate and first and second source/drains, the first dielectric layer having an internal stress different from an internal stress of the second dielectric layer.

A third aspect of the present invention is a method, comprising: forming a field effect transistor, comprising: a first and a second source/drain formed in a silicon substrate, the first and second source/drains spaced apart and separated by a channel region in the substrate; a gate dielectric on a top surface of the substrate over the channel region; and an electrically conductive gate on a top surface of the gate dielectric; and forming a dielectric layer of a first dielectric material over the first and second source/drains; forming a trench in the dielectric layer over the gate; and filling the trench with a second dielectric material to form a dielectric pillar over the gate, the dielectric pillar having no internal stress or an internal stress different from an internal stress of the dielectric layer.

A fourth aspect of the present invention is a method, comprising: forming an NFET, comprising: a first and a second source/drain formed in a silicon substrate, the first and second source/drains spaced apart and separated by a first channel region in the substrate; a first gate dielectric on a top surface of the substrate over the first channel region; and a first electrically conductive gate on a top surface of the first gate dielectric; and forming a PFET, comprising: a third and a fourth source/drain formed in the silicon substrate, the third and fourth source/drains spaced apart and separated by a second channel region in the substrate; a second gate dielectric on the top surface of the substrate over the second channel region; and an electrically conductive second gate on a top surface of the second gate dielectric; and forming a first dielectric layer of a first dielectric material over the first gate and the third and fourth source/drain regions; and forming a second dielectric layer of a second dielectric material over the second gate and first and second source/drains, first dielectric layer having an internal stress different from an internal stress of the second dielectric layer

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
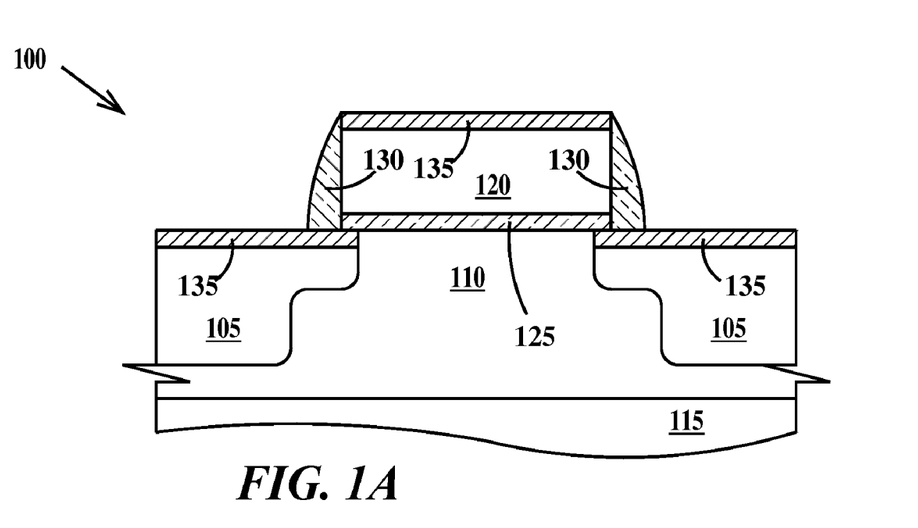
FIGS. 1A through 1E are cross-section views illustrating a method of fabricating stressed dielectric devices according a first embodiment of the present invention.

FIGS. 1A through 1E are cross-section views illustrating a method of fabricating stressed dielectric devices according a first embodiment of the present invention. In FIG. 1A, a field effect transistor (FET) 100 comprises source/drains 105 formed in a well 110 formed in a silicon substrate 115 (or in an uppermost silicon layer of a silicon on insulator (SOI) substrate). In the case of an SOI substrate, the well would extend down to the buried oxide layer (BOX) of the SOI substrate. A gate 120 (which in one example is polysilicon, doped or undoped) is formed over well 110 between source/drains 105 and electrically isolated from the well by a gate dielectric 125 formed on the top surface of substrate 115. Dielectric sidewall spacers 130 are formed on the sidewalls of gate 120. A region of well 110 between source/drains 105 and adjacent to the top surface of substrate 115 is the channel region of the FET. When FET 100 is an N-channel FET (NFET) source/drains 105 are doped N-type and well 110 is doped P-type. When FET 100 is a P-channel FET (PFET) source/drains 105 are doped P-type and well 110 is doped N-type.

Optional metal silicide contacts 135 are formed to the top surfaces of source/drains 105 and gate 120 (when gate 120 is polysilicon). Silicide formation typically requires depositing a metal layer onto the surface of a Si-containing material. The metal layer may be formed using a conventional process including, but not limited to: chemical vapor deposition (CVD), plasma-assisted CVD (PECVD), high-density CVD (HDCVD), plating, sputtering, evaporation and chemical solution deposition. Metals deposited for silicide formation include Ta, Ti, W, Pt, Co, Ni, and combinations thereof. Heat is applied to react the metal with silicon and any unreacted metal removed.

Figure 1B:
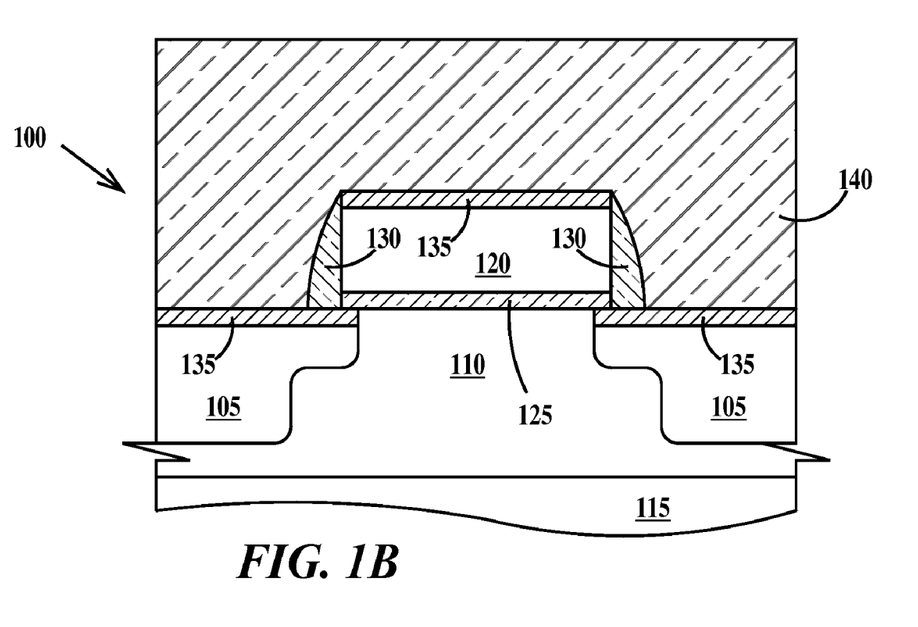

In FIG. 1B, a first dielectric layer 140 is deposited over gate 120 and the top surface of substrate 115. First dielectric layer 140 may be internally under compressive stress, tensile stress or be unstressed. Suitable materials for first dielectric layer 140 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof.

In a first example, PECVD can provide compressive or tensile stressed silicon nitride. The magnitude and stress state of the nitride stress can be controlled by changing the deposition conditions to alter the reaction rate within the deposition chamber. More specifically, the magnitude and stress state of the deposited nitride may be set by changing the deposition conditions such as gas flow rates (e.g. $SiH_4$, $N_2$, He), pressure, radio frequency (RF) power, and electrode gap.

In a second example, rapid thermal CVD (RTCVD) can provide tensile stressed silicon nitride. The magnitude of the internal tensile stress produced can be controlled by changing the deposition conditions. More specifically, the magnitude of the stress state may be set by changing deposition conditions such as: precursor gas composition, precursor gas flow rate and temperature.

Figure 1C:
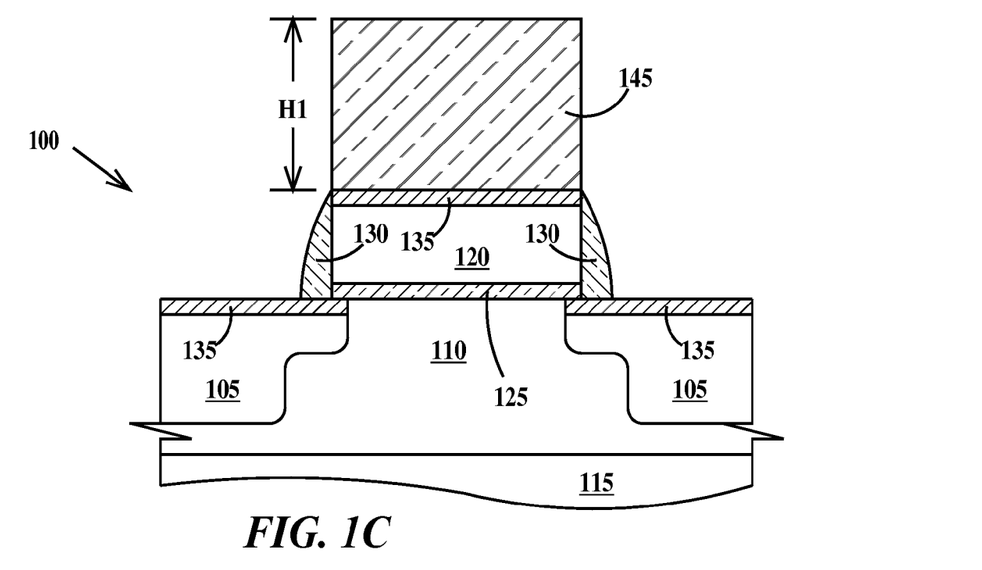

In FIG. 1C, a photolithographic and etch process has been performed on first dielectric layer 140 of FIG. 1B to define a dielectric pillar 145 on top of gate 120. Dielectric pillar 145 has a height H1 that will be discussed infra. The amount of stress in dielectric pillar 145 (if any) is significantly less than the stress (if any) in first dielectric layer 140 (see FIG. 1B) as etching away a region of material around a central region of the material generally removes or reduces the stress in the remaining material.

Figure 1D:
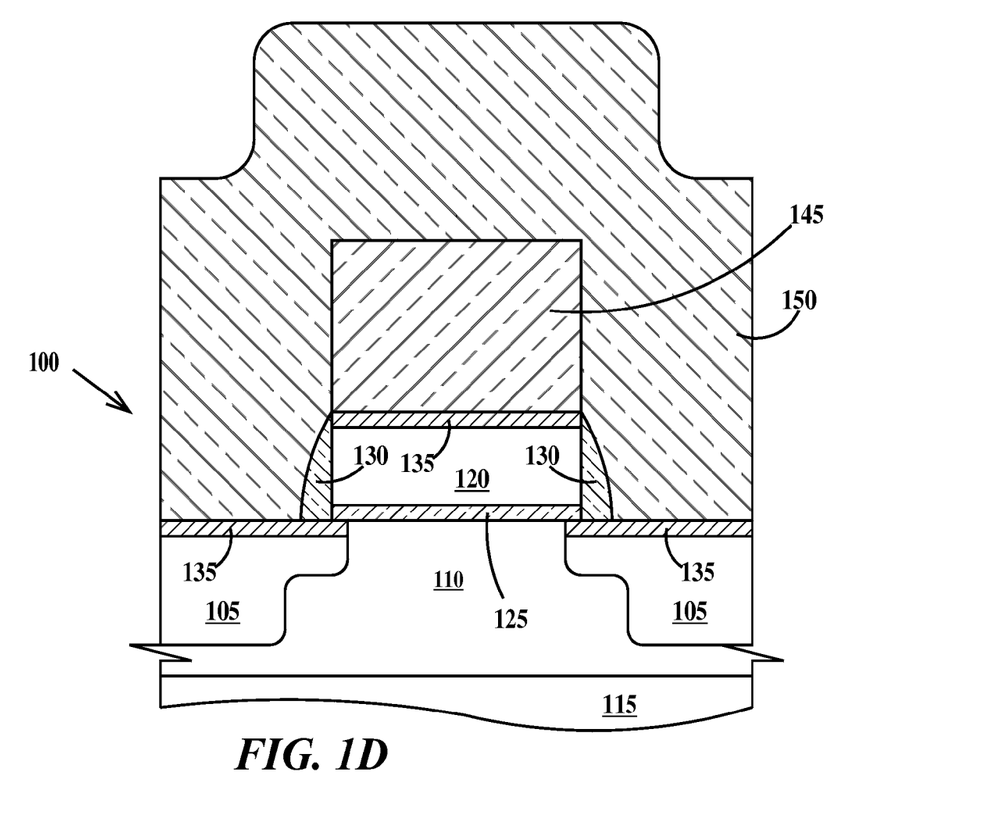
Figure 1E:
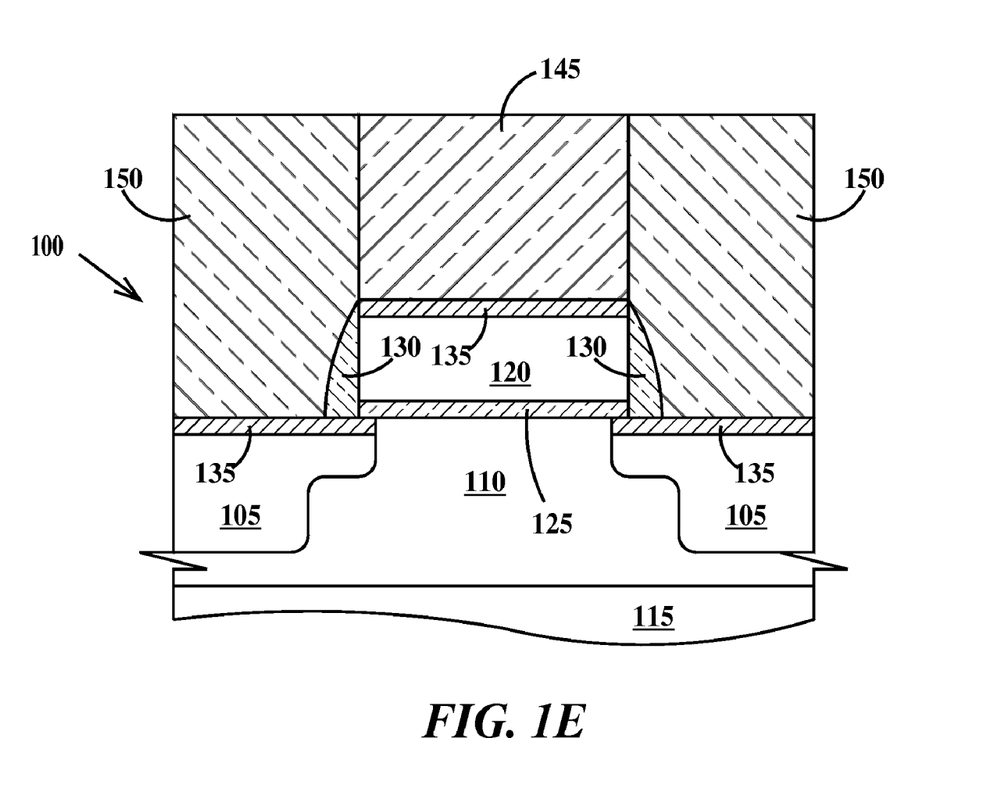

In FIG. 1D, a second dielectric layer 150 is formed on the top surface substrate 150 covering and surrounding gate 120 and dielectric pillar 145. Second dielectric layer 150 is internally tensile stressed if FET 100 is an NFET and internally compressive stressed if FET 100 is a PFET. The internal stress in second dielectric layer 150 is transferred into the channel region of FET 100 (described supra), enhancing the channel carrier mobility of FET 100 compared to the carrier mobility in an otherwise identical FET where second dielectric layer 150 is internally unstressed or has little internal stress or where a single dielectric layer is used (i.e. no pillar 145 is formed).

In NFETs, the mobility of the majority carriers, electrons, is greater (hole mobility is less) when the channel is in tensile stress and in PFETs the mobility of the majority carriers, holes, is greater than (electron mobility is less) when the channel region is in compressive stress. The greater the height H1 (see FIG. 1C) the greater the amount of stress transferred in the channel region of FET 100.

In one example the amount of internal stress (tensile for an NFET and compressive for a PFET) of second dielectric layer 150 is between about 0.5 GPa and about 4 GPa.

Suitable materials for second dielectric layer 150 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof.

At this point, electrical contacts may be formed through second dielectric layer 150 to source/drains 105 and through second dielectric layer 150 and through first dielectric layer 145 to gate 120 (or to corresponding metal silicide contacts 135 if present). Alternatively, in FIG. 1E, a chemical-mechanical-polish (CMP) may be performed to expose a top surface of dielectric pillar 145 and to coplanarize the top surface of dielectric pillar 145 and a top surface of second dielectric layer 150 and then the electrical contacts formed.

Figure 2A:
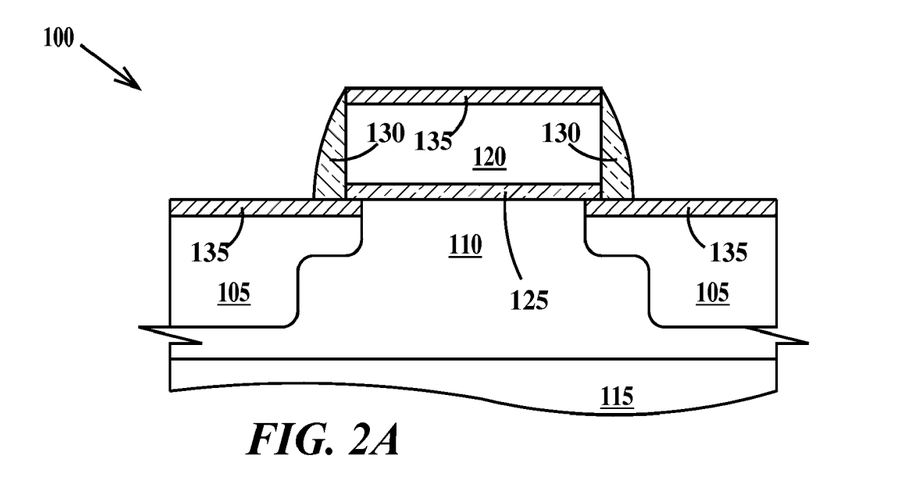
FIGS. 2A through 2E are cross-section views illustrating a method of fabricating stressed dielectric devices according a second embodiment of the present invention.
Figure 2B:
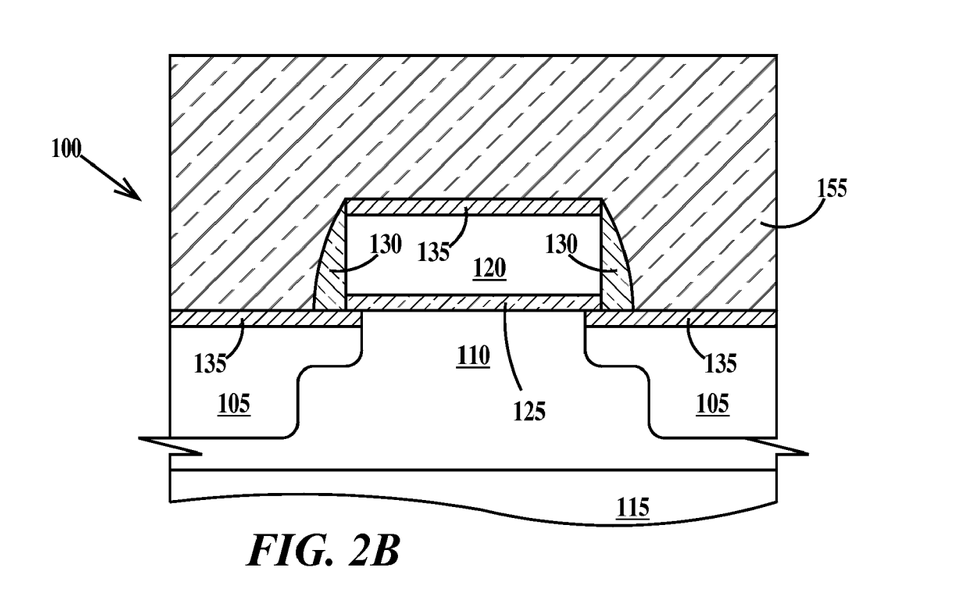

FIGS. 2A through 2E are cross-section views illustrating a method of fabricating stressed dielectric devices according a second embodiment of the present invention. FIG. 2A is identical to FIG. 1A described supra. FIG. 2B is similar to FIG. 1B except first dielectric layer 140 of FIG. 1B is replaced with a first dielectric layer 155. First dielectric layer 155 is a stressed layer.

Suitable materials for first dielectric layer 155 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof. First dielectric layer 155 is internally tensile stressed if FET 100 is an NFET and internally compressive stressed if FET 100 is a PFET.

Figure 2C:
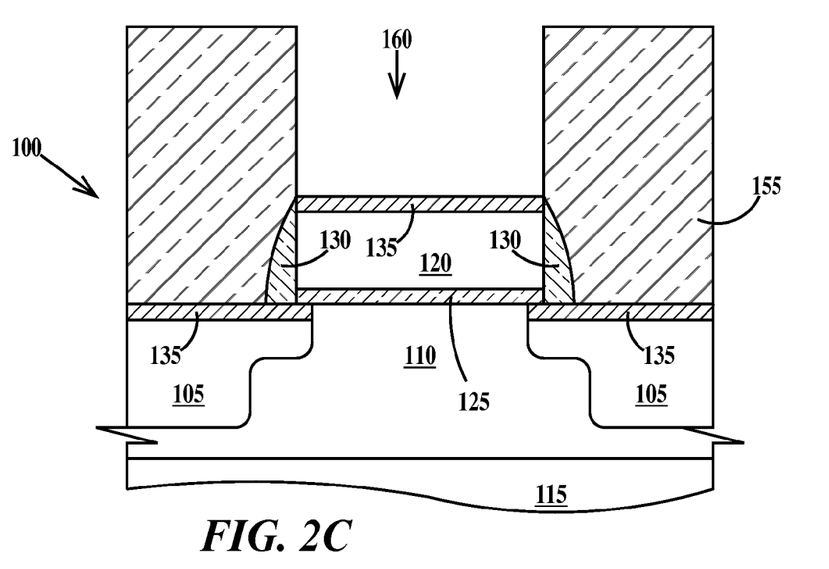
Figure 2D:
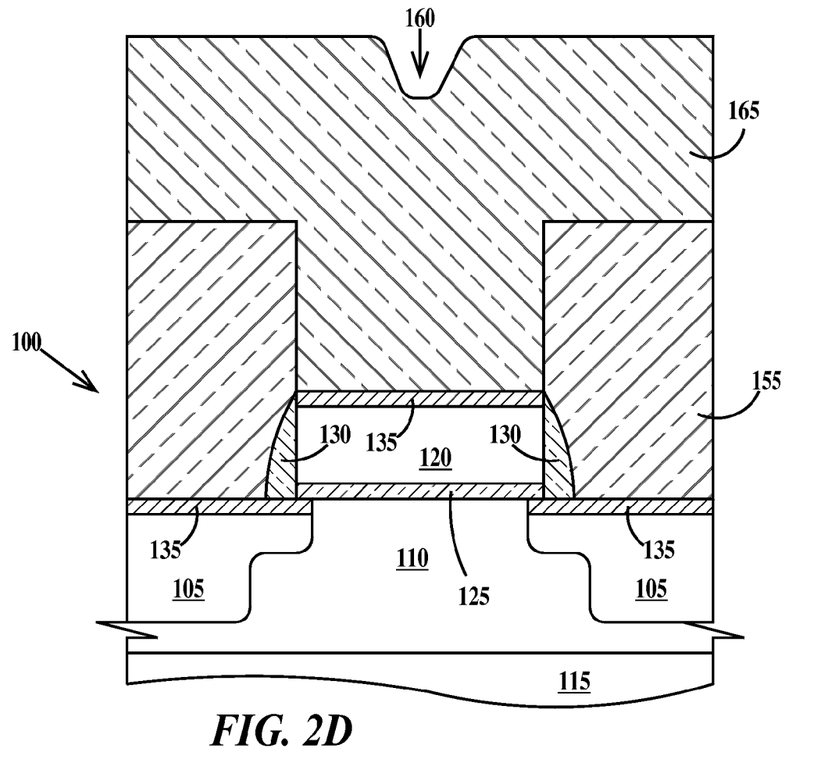
Figure 2E:
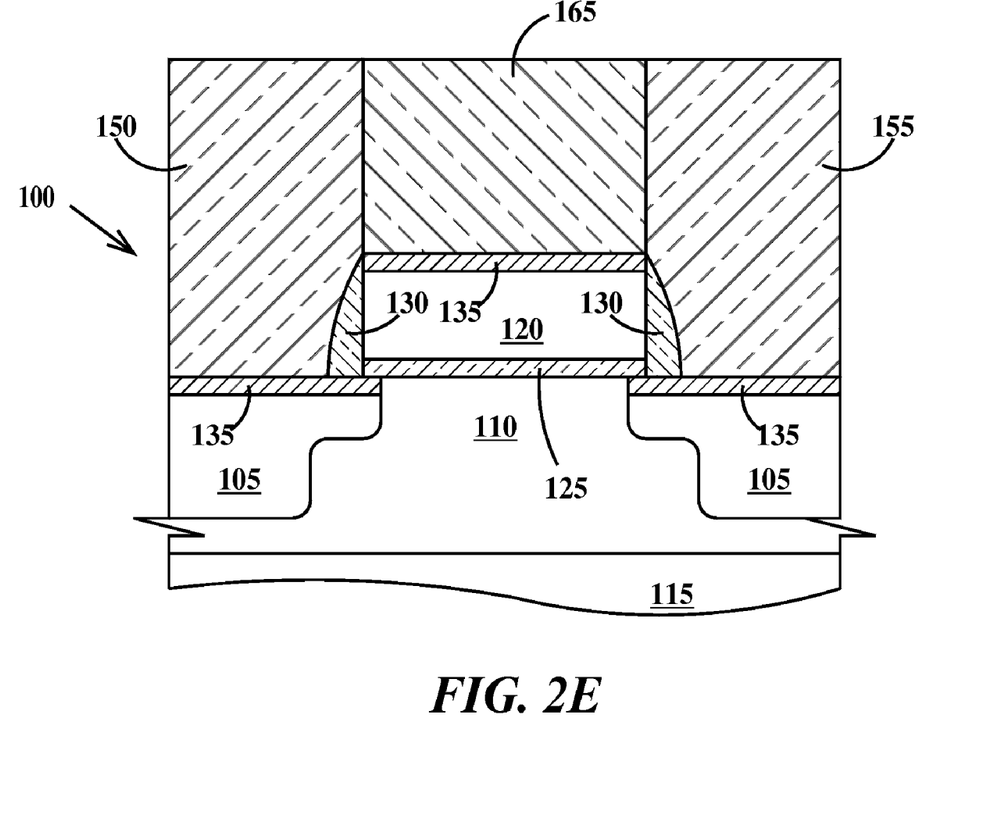

In FIG. 2C, a photolithographic and etch process has been performed on first dielectric layer 155 to define an opening 160 on top of gate 120 over the channel region of FET 100. In FIG. 2D, a second dielectric layer 165 is formed on the top surface of first dielectric layer 155 and completely filling opening 160. Second dielectric layer 165 is internally compressive stressed if FET 100 is an NFET and internally tensile stressed if FET 100 is a PFET. The opposite stresses in first dielectric layer 155 and second dielectric layer 165 combine to further increase the stress induced in the channel region of FET 100 enhancing the channel carrier mobility of FET 100 compared to the carrier mobility in an otherwise identical FET where first dielectric layer 155 and second dielectric layer 165 are internally unstressed or have little internal stress or where a single dielectric layer is used.

Suitable materials for second dielectric layer 165 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof.

In one example, the amount of internal stress of first dielectric layer 155 (tensile for a NFET and compressive for a PFET) is between about 0.5 GPa and about 4 GPa and the amount of internal stress of second dielectric layer 165 (compressive for a NFET and tensile for a PFET) is between about 0.5 GPa and about 4 GPa.

At this point, electrical contacts may be formed through second dielectric layer 165 and first dielectric layer 155 to source/drains 105 (or to corresponding metal silicide contacts 135 if present) and through second dielectric layer 165 to gate 120 (or to corresponding metal silicide contacts 135 if present). Alternatively, in FIG. 2E, CMP may be performed to expose a top surface of first dielectric layer 155 and to coplanarize the top surface of first dielectric layer 155 and a top surface of second dielectric layer 165 and then the electrical contacts formed.

Figure 3A:
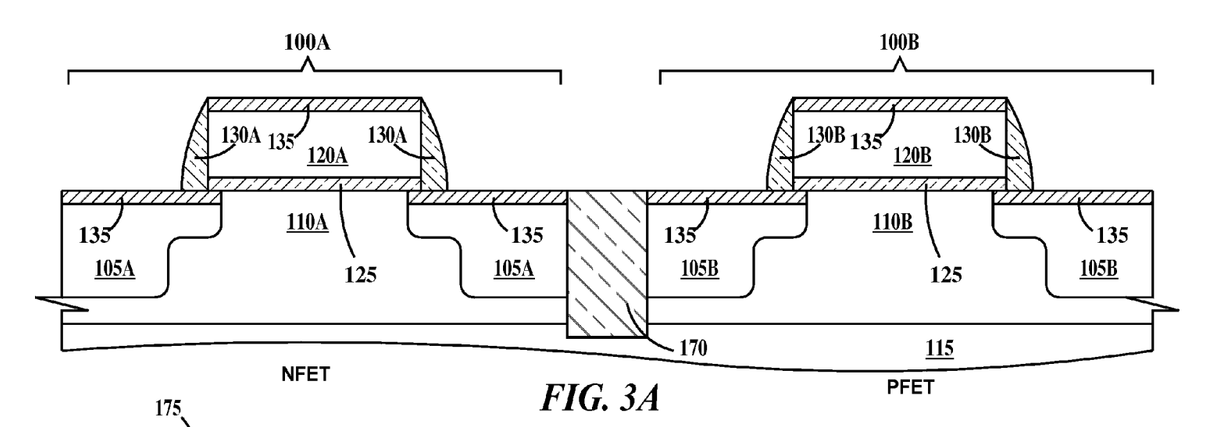
FIGS. 3A through 3D are cross-section views illustrating a method of fabricating stressed dielectric devices according a third embodiment of the present invention.

FIGS. 3A through 3D are cross-section views illustrating a method of fabricating stressed dielectric devices according to a third embodiment of the present invention. In FIG. 3A, both an NFET 100A and a PFET 100B are formed in silicon substrate 115. Both NFET 100A and PFET 100B are similar to FET 100 of FIG. 1A except specifically NFET 100A includes N-doped source/drains 105A, P-doped channel 110A, a gate 120A and dielectric sidewall spacers 130A and PFET 100B includes P-doped source/drains 105B, N-doped channel 110B, a gate 120B and dielectric sidewall spacers 130B. The source/drains of NFET 100A and PFET 100B are electrically isolated from each other by a dielectric isolation 170 formed in substrate 115 which surrounds each FET. Other isolation schemes, such a diffused isolation or a combination of diffused isolation and dielectric isolation as known in the art by be used in place of dielectric isolation 170. In the case substrate 115 is an SOI substrate, dielectric isolation 170 would extend down to the BOX layer of the SOI substrate.

Figure 3B:
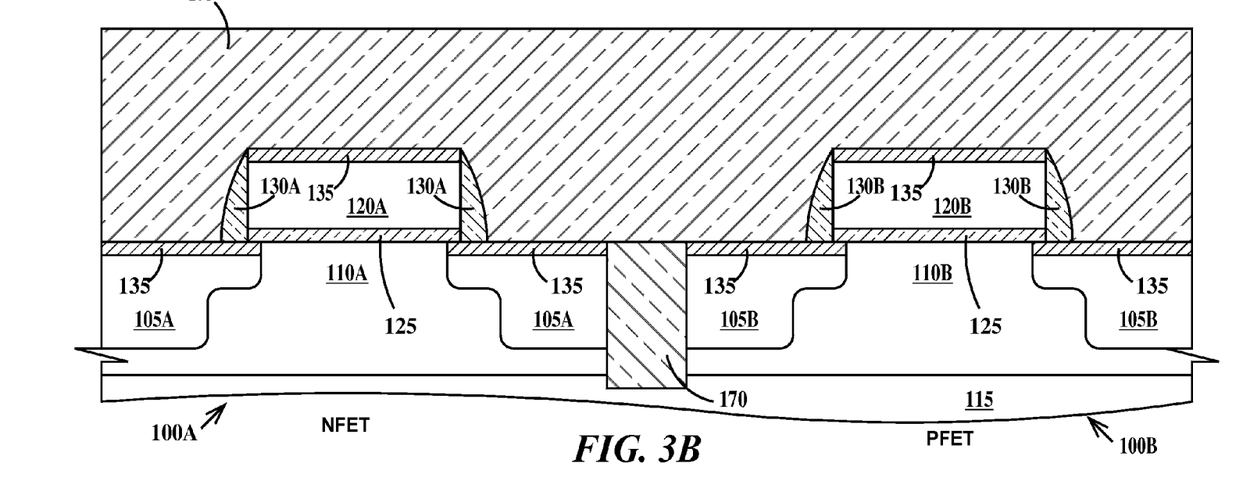

In FIG. 3B, a first dielectric layer 170 is deposited over gates 120A and 120B and source/drains 105A and 105B and trench isolation 170. First dielectric layer 175 is internally under tensile stress. Suitable materials for first dielectric layer 175 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof. In one example the amount of compressive internal stress of first dielectric layer 175 is between about 0.5 GPa and about 4 GPa.

Figure 3C:
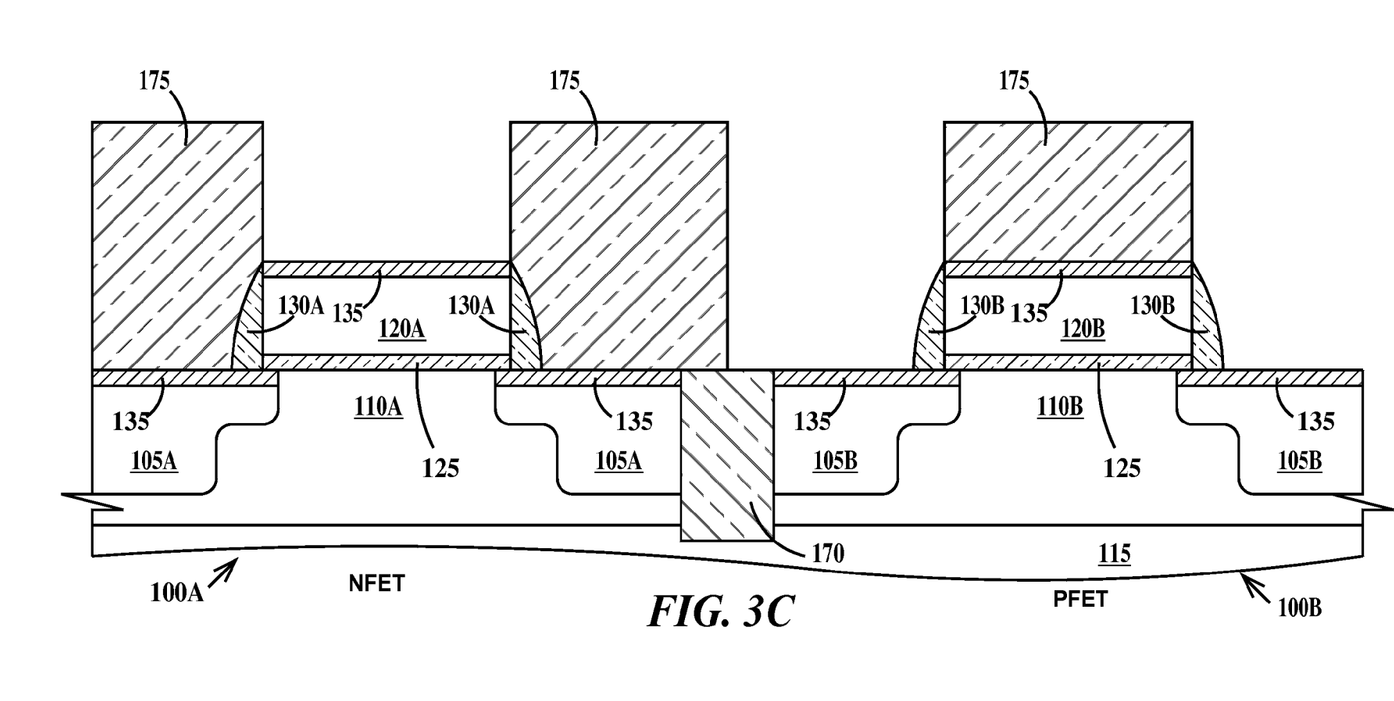
Figure 3D:
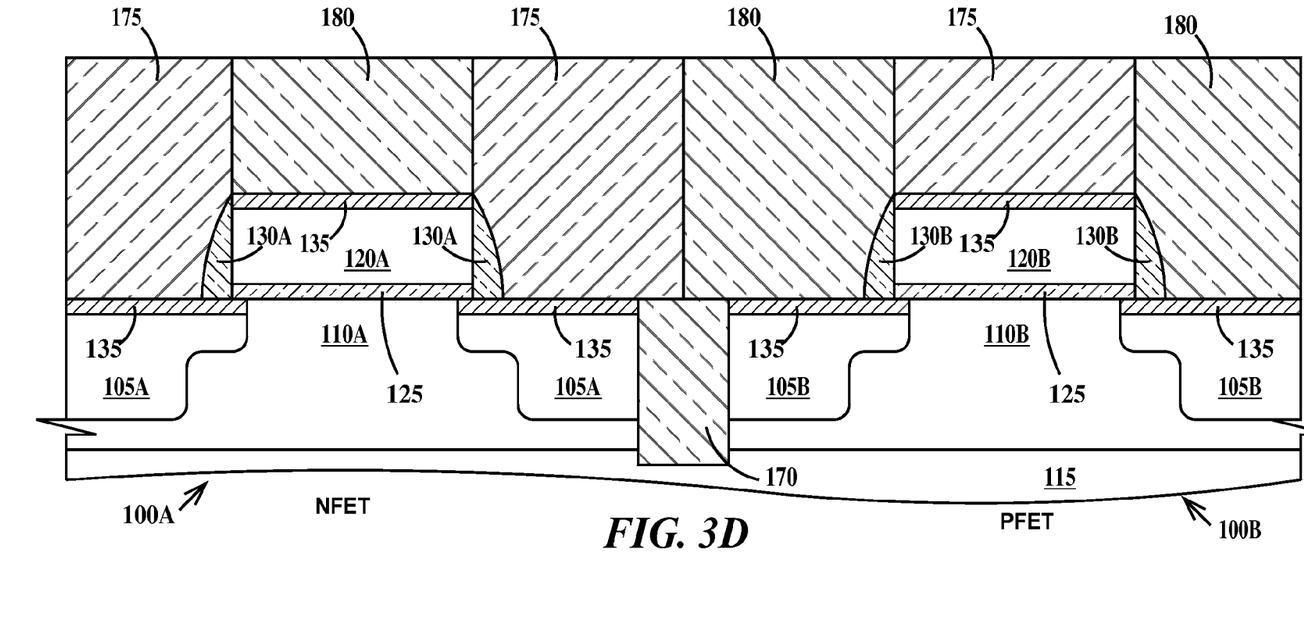

In FIG. 3C, first dielectric layer 175 is removed from over gate 120A and from over source/drains 105B, but not from over gate 120B or source/drains 105A. In FIG. 3D, a second dielectric layer 180 is deposited over gate 120A and over source/drains 105B. Second dielectric layer 180 is internally under compressive stress. Then an optional CMP is performed so top surfaces of first dielectric layer 175 and second dielectric layer 180 are coplanar. Suitable materials for second dielectric layer 180 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof. In one example the amount of internal tensile stress of second dielectric layer 180 is between about 0.5 GPa and about 4 GPa.

At this point, electrical contacts may be formed through first dielectric layer 175 to source/drains 105A and gate 120B (or to corresponding metal silicide contacts 135 if present) and through second dielectric layer 180 and source/drains 105B and gate 120A (or to corresponding metal silicide contacts 135 if present).

The opposite stresses in first dielectric layer 175 and second dielectric layer 180 combine to further increase the tensile stress induced in the channel regions of NFET 100A and the compressive stress induced in the channel regions of PFET 100B enhancing the channel carrier mobility of both NFET 100A and PFET 110B compared to the carrier mobility in an otherwise identical NFETs and PFETs where first dielectric layer 175 and second dielectric layer 180 are internally unstressed or have little internal stress or where a single dielectric layer is used. Again, the greater the thickness of dielectric over a gate, the more stress is induced in the channel region of the FET.

FIGS. 4A through 4D are cross-section views illustrating a method of fabricating stressed dielectric devices according to a fourth embodiment of the present invention. FIGS. 4A through 4D are similar to FIGS. 3A through 3D except the sequence of deposition of the tensile and compressive dielectric layers are reversed and thus the pattern of etching the first dielectric layer is also reversed.

Figure 4A:
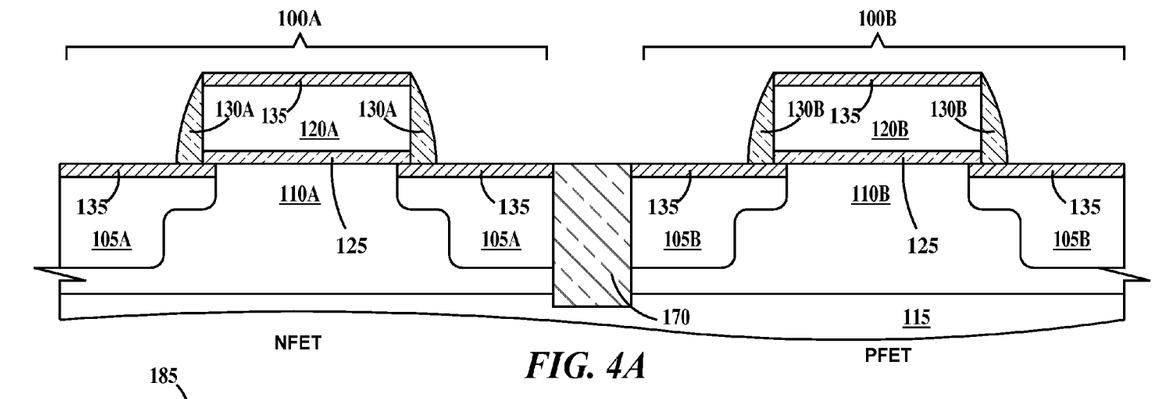
FIGS. 4A through 4D are cross-section views illustrating a method of fabricating stressed dielectric devices according a fourth embodiment of the present invention.
Figure 4B:
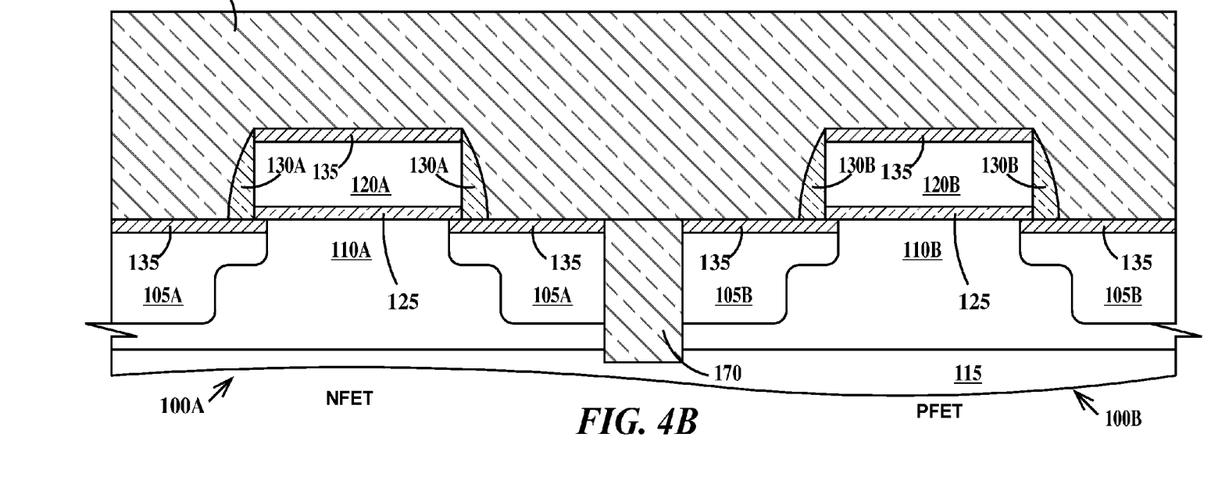

FIG. 4A is identical to FIG. 3A. In FIG. 4B, a first dielectric layer 185 is deposited over gates 120A and 120B, source drains 105A and 105B and the top surface of trench isolation 170. First dielectric layer 185 is internally under compressive stress. Suitable materials for first dielectric layer 185 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof. In one example the amount of compressive internal stress of first dielectric layer 185 is between about 0.5 GPa and about 4 GPa.

Figure 4C:
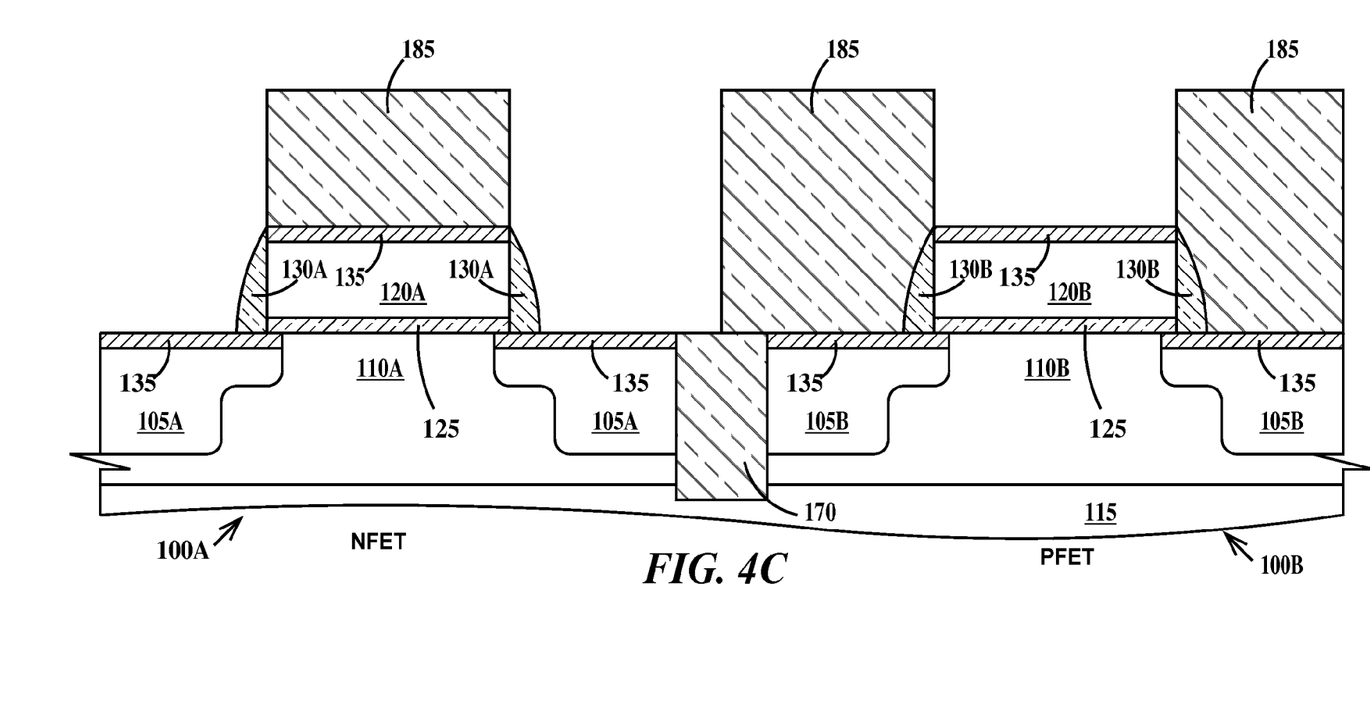
Figure 4D:
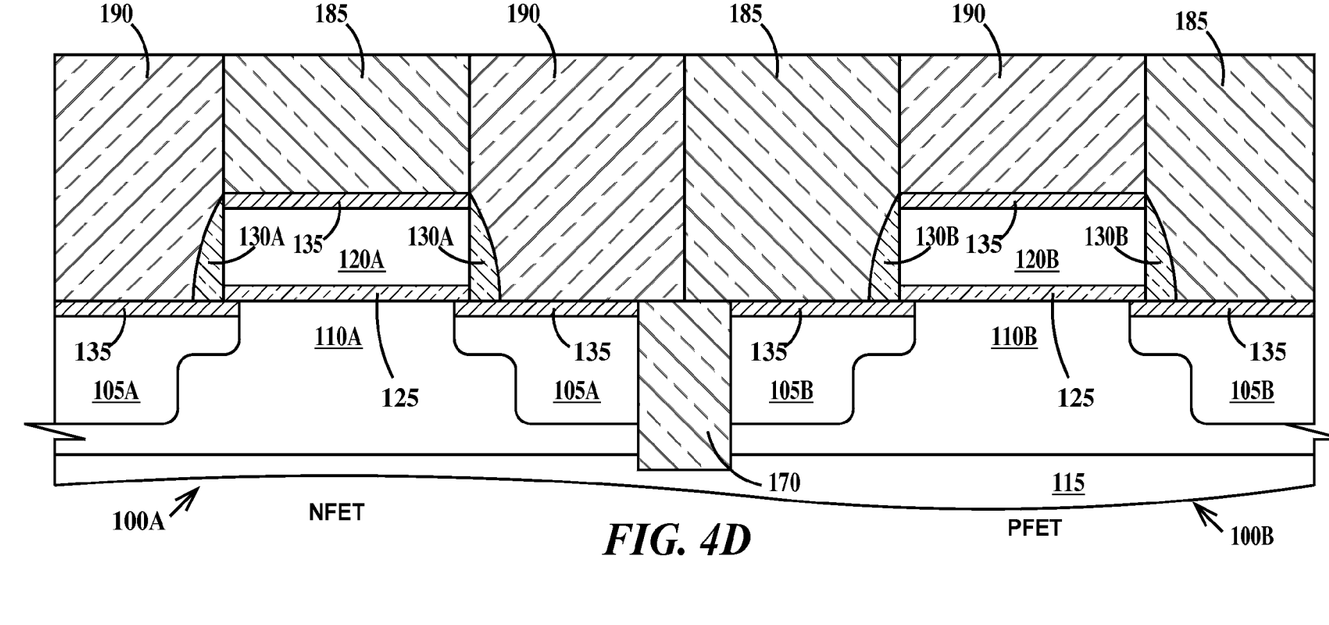

In FIG. 4C, first dielectric layer 185 is removed from over gate 120B over source/drains 105A, but not from over gate 120A and source/drains 105B. In FIG. 4D, a second dielectric layer 190 is deposited over gate 120B and over source/drains 105A. Second dielectric layer 190 is internally under tensile stress. Then an optional CMP is performed so top surfaces of first dielectric layer 185 and second dielectric layer 190 are coplanar. Suitable materials for second dielectric layer 190 include but are not limited to silicon nitride, silicon carbide, hydrogenated silicon carbide, hydrogenated silicon carbon nitride, hydrogenated silicon oxycarbide, hydrogenated silicon oxy-carbon nitride and combinations thereof in a single layer and combinations of layers thereof. In one example the amount of internal tensile stress of second dielectric layer 190 is between about 0.5 GPa and about 4 GPa.

At this point, electrical contacts may be formed through first dielectric layer 185 to source/drains 105B and gate 120A (or to corresponding metal silicide contacts 135 if present) and through second dielectric layer 190 and source/drains 105A and gate 120B (or to corresponding metal silicide contacts 135 if present).

The opposite stresses in first dielectric layer 185 and second dielectric layer 190 combine to further increase the tensile stress induced in the channel regions of NFET 100A and the compressive stress induced in the channel regions of PFET 100B enhancing the channel carrier mobility of both NFET 100A and PFET 110B compared to the carrier mobility in an otherwise identical NFETs and PFETs where first dielectric layer 185 and second dielectric layer 190 are internally unstressed or have little internal stress or where a single dielectric layer is used. Again, the greater the thickness of dielectric over a gate, the more stress is induced in the channel region of the FET.

Thus, the embodiments of the present invention provide devices with enhanced majority channel carrier mobility and methods of fabricating devices with enhanced majority channel carrier mobility.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
a field effect transistor comprising:
a first and a second source/drain formed in a silicon substrate, said first and second source/drains spaced apart and separated by a channel region in said substrate;
a gate dielectric on a top surface of said substrate over said channel region; and
an electrically conductive gate on a top surface of said gate dielectric; and
a dielectric pillar of a first dielectric material over said gate; and
a dielectric layer of a second dielectric material over said first and second source/drains, sidewalls of said dielectric pillar in direct physical contact with said dielectric layer, said dielectric pillar having an internal stress different from an internal stress of said dielectric layer.

2. The structure of claim 1, wherein said dielectric pillar has no internal stress.

3. The structure of claim 1, wherein said field effect transistor is an NFET and said internal stress of said dielectric layer is a tensile stress and said dielectric pillar has no internal stress.

4. The structure of claim 1, wherein said field effect transistor is an NFET and said internal stress of said dielectric layer is a tensile stress of a lower magnitude than an internal tensile stress of said dielectric pillar.

5. The structure of claim 1, wherein said field effect transistor is an NFET and said internal stress of said dielectric layer is a tensile stress and said internal stress of said dielectric pillar is a compressive stress.

6. The structure of claim 1, wherein said field effect transistor is a PFET and said internal stress of said dielectric layer is a compressive stress and said dielectric pillar has no internal stress.

7. The structure of claim 1, wherein said field effect transistor is a PFET and said internal stress of said dielectric layer is a compressive stress of a lower magnitude than an internal compressive stress of said dielectric pillar.

8. The structure of claim 1, wherein said field effect transistor is a PFET and said internal stress of said dielectric layer is a compressive stress and said internal stress of said dielectric pillar is a tensile stress.

9. The structure of claim 1, wherein said internal stress of said dielectric layer is between about 0.5 GPa and about 4 GPa.

10. The structure of claim 1, wherein said first and second materials have the same composition of matter.

11. The structure of claim 1, wherein said first and second materials are independently selected from the group consisting of silicon nitride, silicon carbide, hydrogenated silicon carbide, hydrogenated silicon carbon nitride, hydrogenated silicon oxycarbide, hydrogenated silicon oxy-carbon nitride and combinations thereof.

12. The structure of claim 1, wherein said field effect transistor is an NFET and an electron mobility in said channel region is greater than an electron mobility of an otherwise identical NFET without said dielectric pillar and where an unstressed dielectric layer is formed over a gate and source/drains of said otherwise identical NFET.

13. The structure of claim 1, wherein said field effect transistor is a PFET and a hole mobility in said channel region is greater than a hole mobility of an otherwise identical PFET without said dielectric pillar and where an unstressed dielectric layer is formed over a gate and source/drains of said otherwise identical PFET.

14. A method, comprising:
forming a field effect transistor, comprising:
a first and a second source/drain formed in a silicon substrate, said first and second source/drains spaced apart and separated by a channel region in said substrate;
a gate dielectric on a top surface of said substrate over said channel region; and
an electrically conductive gate on a top surface of said gate dielectric; and
forming a dielectric layer of a first dielectric material over said first and second source/drains;
forming a trench in said dielectric layer over said gate; and
filling said trench with a second dielectric material to form a dielectric pillar over said gate, said dielectric pillar having an internal stress different from an internal stress of said dielectric layer.

15. The method of claim 14, wherein said dielectric pillar has no internal stress.

16. The method of claim 14, wherein said field effect transistor is an NFET and said internal stress of said dielectric layer is a tensile stress and said dielectric pillar has no internal stress.

17. The method of claim 14, wherein said field effect transistor is an NFET and said internal stress of said dielectric layer is a tensile stress of a higher magnitude than an internal tensile stress of said dielectric pillar.

18. The method of claim 14, wherein said field effect transistor is an NFET and said internal stress of said dielectric layer is a tensile stress and said internal stress of said dielectric pillar is a compressive stress.

19. The method of claim 14, wherein said field effect transistor is a PFET and said internal stress of said dielectric layer is a compressive stress of a higher magnitude than an internal compressive stress of said dielectric pillar.

20. The method of claim 14, wherein said field effect transistor is a PFET and said internal stress of said dielectric layer is a compressive stress and said internal stress of said dielectric layer is a compressive stress of a higher magnitude than said internal stress of said dielectric pillar.

21. The method of claim 14, wherein said field effect transistor is a PFET and said internal stress of said dielectric layer is a compressive stress and said internal stress of said dielectric pillar is a tensile stress.

22. The method of claim 14, wherein said internal stress of said dielectric layer is between about 0.5 GPa and about 4 GPa.

23. The method of claim 14, wherein said first and second materials have the same composition of matter.

24. The method of claim 14, wherein said first and second materials are independently selected from the group consisting of silicon nitride, silicon carbide, hydrogenated silicon carbide, hydrogenated silicon carbon nitride, hydrogenated silicon oxycarbide, hydrogenated silicon oxy-carbon nitride and combinations thereof.

25. The method of claim 14, wherein said field effect transistor is an NFET and an electron mobility in said channel region is greater than an electron mobility an otherwise identical NFET without said dielectric pillar and where an unstressed dielectric layer is formed over a gate and source/drains of said otherwise identical NFET.

26. The method of claim 14, wherein said field effect transistor is a PFET and a hole mobility in said channel region is greater than a hole mobility of an otherwise identical PFET without said dielectric pillar and where an unstressed dielectric layer is formed over a gate and source/drains of said otherwise identical PFET.

* * * * *